(12) United States Patent
Wang et al.

(10) Patent No.: US 9,360,505 B1
(45) Date of Patent: Jun. 7, 2016

(54) SQUELCH DETECTOR

(71) Applicants: GLOBAL UNICHIP CORPORATION, Hsinchu (TW); TAIWAN SEMICONDUCTOR MANUFACTURING CO., LTD., Hsin-Chu (TW)

(72) Inventors: Ju-Chieh Wang, Hsinchu (TW); Ting-Hsu Chien, Hsinchu (TW); Da-Rong Huang, Hsinchu (TW)

(73) Assignees: GLOBAL UNICHIP CORPORATION, Hsinchu (TW); TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days.

(21) Appl. No.: 14/798,932

(22) Filed: Jul. 14, 2015

(51) Int. Cl.
G01R 19/165 (2006.01)
H03K 5/1532 (2006.01)
H03K 5/24 (2006.01)

(52) U.S. Cl.
CPC .......... *G01R 19/165* (2013.01); *G01R 19/1659* (2013.01); *H03K 5/1532* (2013.01); *H03K 5/2481* (2013.01)

(58) Field of Classification Search
CPC ........... G01R 19/165; G01R 19/16504; G01R 19/16528; G01R 19/16566; G01R 19/1659; G01R 19/16595; H03K 5/1532; H03K 5/24; H03K 5/2418; H03K 5/2472; H03K 5/2481
USPC .......... 327/50, 52, 53, 56, 58, 62, 74, 76, 77, 327/82, 89, 97, 103
See application file for complete search history.

(56) References Cited

U.S. PATENT DOCUMENTS

| | | | |
|---|---|---|---|
| 7,471,118 B2 | 12/2008 | Liu | |
| 7,653,367 B2 | 1/2010 | Song et al. | |
| 8,538,362 B2 | 9/2013 | Srivastava et al. | |
| 8,542,035 B2 | 9/2013 | Park et al. | |
| 9,319,041 B1* | 4/2016 | Wang | H03K 5/2481 |
| 2001/0050588 A1* | 12/2001 | Redman-White | G06G 7/14 327/361 |
| 2007/0238429 A1 | 10/2007 | Song et al. | |
| 2012/0280721 A1 | 11/2012 | Park et al. | |

\* cited by examiner

*Primary Examiner* — William Hernandez
(74) *Attorney, Agent, or Firm* — WPAT, P.C.; Justin King (57) ABSTRACT

A squelch detector receives a first input signal, a second input signal, a first reference voltage and a second reference voltage. The first input signal and the second input signal are collaboratively defined as a differential input signal pair. The difference between the first reference voltage and the second reference voltage is defined as a squelch threshold. According to the squelch threshold, the squelch detector generates a detected signal to indicate whether the differential input signal pair is valid or not.

14 Claims, 8 Drawing Sheets

SQUELCH DETECTOR

FIELD OF THE INVENTION

The present invention relates to a detector, and more particularly to a squelch detector.

BACKGROUND OF THE INVENTION

Generally, USB devices, PCIe devices, mobile industry processor interface (MIPI) devices transmit data according to differential signals. In addition, these devices are usually equipped with squelch detectors to detect whether the differential signals are valid.

Figure 1A:
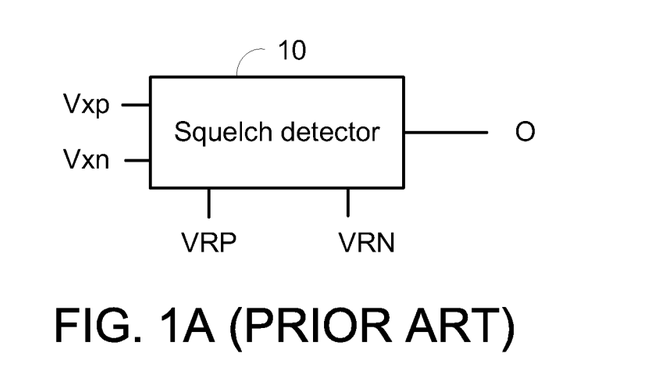
FIG. 1A (prior art) schematically illustrates the relationships between associated signals and a squelch detector.
Figure 1B:
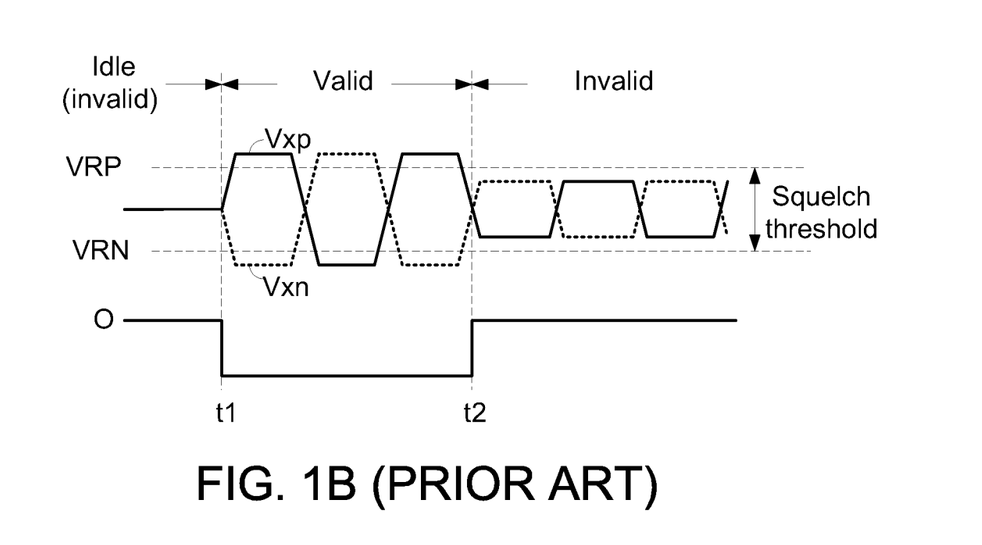
FIG. 1B (prior art) is a schematic timing waveform diagram illustrating associated signals processed by the squelch detector.

FIG. 1A schematically illustrates the relationships between associated signals and a squelch detector. FIG. 1B is a schematic timing waveform diagram illustrating associated signals processed by the squelch detector. The squelch detector 10 receives a first input signal Vxp and a second input signal Vxn. The first input signal Vxp and the second input signal Vxn are collaboratively defined as a differential input signal pair. Moreover, the squelch detector 10 receives a first reference voltage VRP and a second reference voltage VRN, wherein the first reference voltage VRP is higher than the second reference voltage VRN. Moreover, the difference between the first reference voltage VRP and the second reference voltage VRN is defined as a squelch threshold.

The squelch detector 10 judges the differential input signal pair according to the squelch threshold, and generates a detected signal O according to the judging result. The detected signal O indicates whether the differential input signal pair is valid or not.

Please refer to FIG. 1B. Before the time point t1, the two input signals of the differential input signal pair are in an idle state. Consequently, the two input signals of the differential input signal pairs are maintained at the same voltage. The magnitude of this voltage is in the range between the first reference voltage VRP and the second reference voltage VRN. Under this circumstance, the detected signal O is in a first logic-level state (e.g. a high logic-level state). The detected signal O in the first logic-level state represents the invalid differential input signal pair. The invalid differential input signal pair is also referred as a squelched signal.

In the time interval between the time point t1 and the time point t2, the maximum values of the first input signal Vxp and the second input signal Vxn are higher than the first reference voltage VRP, and the minimum values of the first input signal Vxp and the second input signal Vxn are lower than the second reference voltage VRN. Under this circumstance, the detected signal O is in a second logic-level state (e.g. a low logic-level state). The detected signal O in the second logic-level state represents the valid differential input signal pair. The valid differential input signal pair is also referred as a not-squelched signal.

After the time point t2, the maximum values of the first input signal Vxp and the second input signal Vxn are lower than the first reference voltage VRP, and the minimum values of the first input signal Vxp and the second input signal Vxn are higher than the second reference voltage VRN. Under this circumstance, the detected signal O is in the first logic-level state (e.g. the high logic-level state). The detected signal O in the first logic-level state represents the invalid differential input signal pair or the squelched signal. Generally, if the detected signal O represents the invalid differential input signals, it means that the first input signal Vxp and the second input signal Vxn are bad signals or noise.

Figure 2:
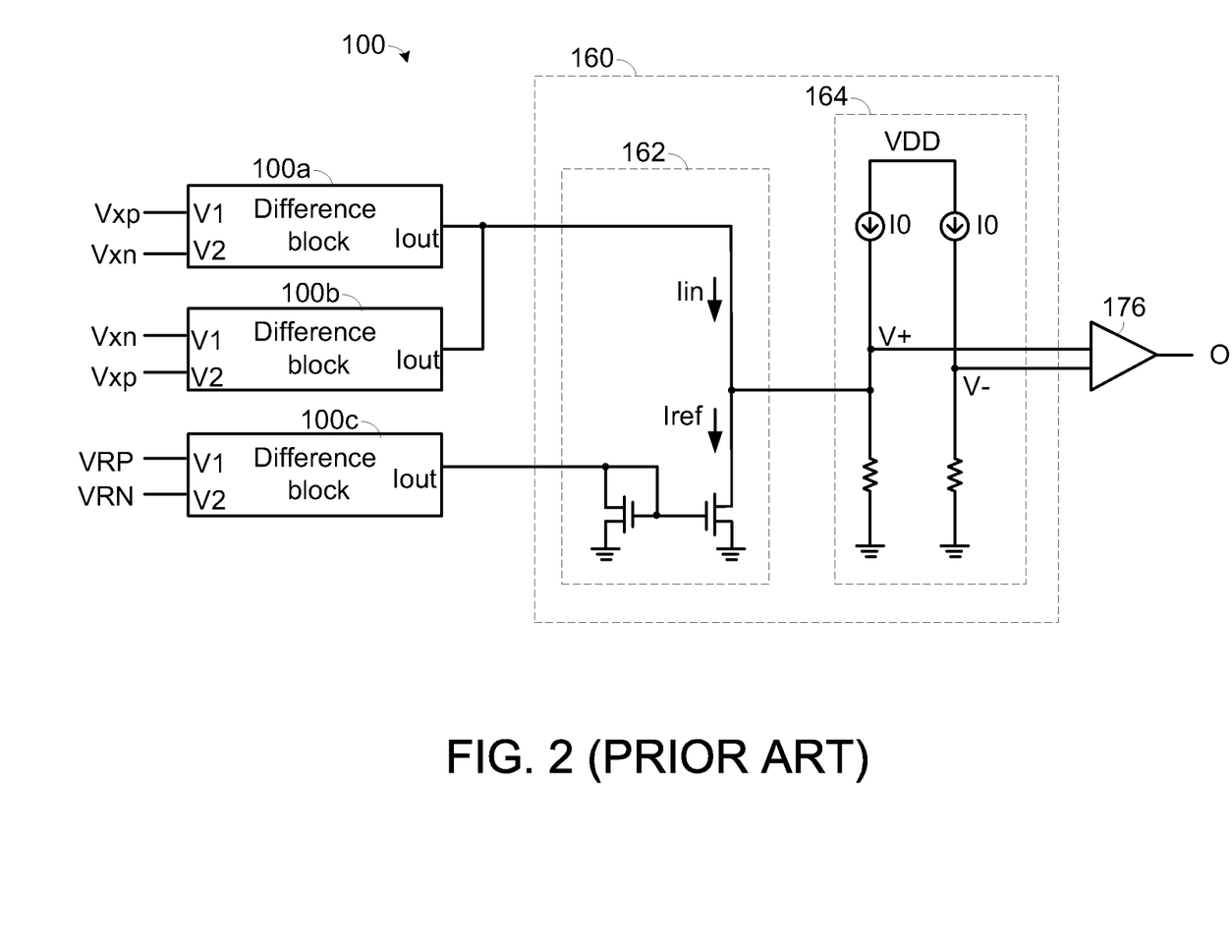
FIG. 2 (prior art) schematically illustrates the architecture of a conventional squelch detection system for high speed data links.

FIG. 2 schematically illustrates the architecture of a conventional squelch detection system for high speed data links. This squelch detection system is disclosed in U.S. Pat. No. 7,471,118 for example. As shown in FIG. 2, the squelch detection system 100 comprises plural difference blocks 100a~100c, a difference circuit 160, and a comparing circuit 176.

After a first reference voltage VRP and a second reference voltage VRN are received by the difference block 100c, a reference current Iref is outputted from a current output terminal Iout of the difference block 100c. The current output terminals Iout of the difference blocks 100a and 100b are connected with each other to output an input current Iin.

Moreover, the difference circuit 160 comprises a first part 162 and a second part 164. According to the relationship between the input current Iin and the reference current Iref, a V+ voltage of the second part 164 is correspondingly changed by the first part 162. For example, if the input current Iin is lower than the reference current Iref, the V+ voltage decreases and thus the V+ voltage is lower than the V− voltage. Whereas, if the input current Iin is higher than the reference current Iref, the V+ voltage increases and thus the V+ voltage is higher than the V− voltage.

For example, if the maximum values of the first input signal Vxp and the second input signal Vxn are lower than the first reference voltage VRP and the minimum values of the first input signal Vxp and the second input signal Vxn are higher than the second reference voltage VRN, the input current Iin is lower than the reference current Iref. Consequently, the V+ voltage is lower than the V− voltage. Under this circumstance, a detected signal O issued from the comparing circuit 176 is in a first logic-level state (e.g. a high logic-level state). The detected signal O in the first logic-level state represents the invalid differential input signal pair.

On the other hand, if the maximum values of the first input signal Vxp and the second input signal Vxn are higher than the first reference voltage VRP and the minimum values of the first input signal Vxp and the second input signal Vxn are lower than the second reference voltage VRN, the input current Iin is higher than the reference current Iref. Consequently, the V+ voltage increases and the V+ voltage is higher than the V− voltage. Under this circumstance, the detected signal O issued from the comparing circuit 176 is in a second logic-level state (e.g. a low logic-level state). The detected signal O in the second logic-level state represents the valid differential input signal pair.

Figure 3A:
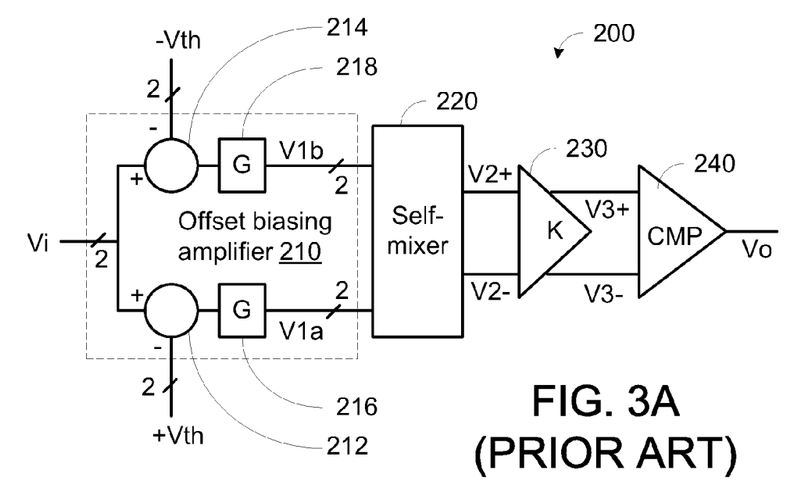
FIG. 3A to FIG. 3C (prior art) schematically illustrate the architecture of another conventional squelch detector.
Figure 3B:
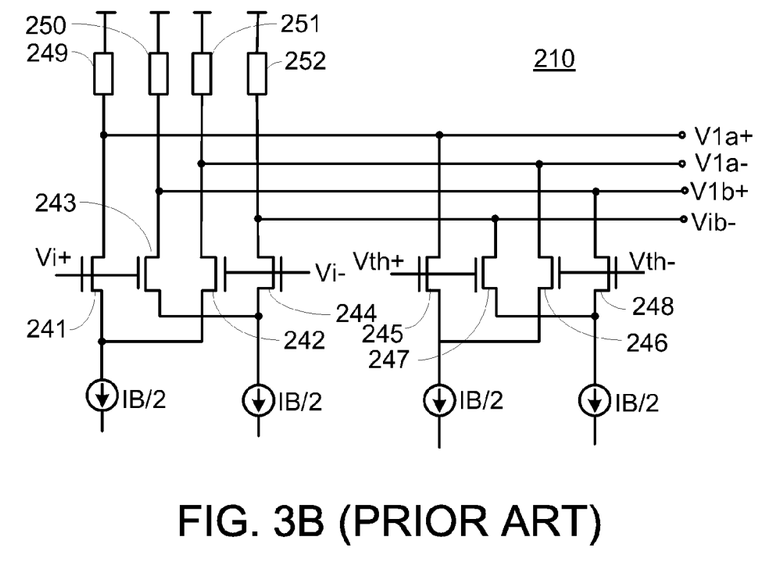
Figure 3C:
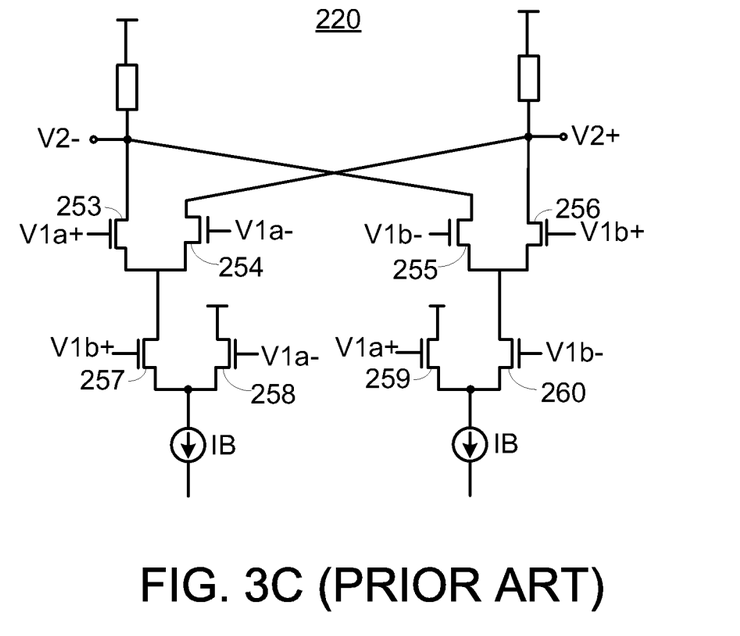

FIG. 3A to FIG. 3C schematically illustrate the architecture of another conventional squelch detector. This squelch detector is disclosed in US Publication No. 2007/0238429. As shown in FIG. 3A, the squelch detector 200 includes a differential offset biasing amplifier 210, a differential self-mixer 220 coupled to the differential offset biasing amplifier 210, a differential comparator 240, and a differential gain stage 230 coupled between the differential self-mixer 220 and the differential comparator 240.

The differential offset biasing amplifier 210 receives a differential input signal $Vi=(Vi^+ - Vi^-)$ at a first set of differential input terminals and a differential squelch detection threshold signal $Vth=(Vth^+ - Vth^-)$ at a second set of differential input terminals. The differential offset biasing amplifier 210 includes a first differential circuit 212 and a second differential circuit 214. In operation, the first differential circuit 212 subtracts the differential squelch detection threshold signal $(Vth^+ - Vth^-)$ from the differential input signal $(Vi^+ - Vi^-)$ to generate a first differential offset biased signal $(V1a)$. The second differential circuit 214 adds the differential squelch detection threshold signal $(Vth^+ - Vth^-)$ to the differential input signal (Vi⁺–Vi⁻) to generate a second differential offset biased signal (V1b). Each of the differential circuits 212 and 214 may also provide gain G as an integral function or the gain may be provided by a separate gain circuit 216, 218. Thereafter, the differential offset biased signals (V1a, V1b) are outputted from the differential offset biasing amplifier 210.

The differential self-mixer 220 receives the differential offset biased signals (V1a, V1b) at its input terminals. The differential self-mixer 220 is fully differential and selectively passes and mixes the detected positive and negative peaks from the differential offset biased signals and down converts the signal directly to a differential direct current signal (V2). Thereafter, the differential direct current signal (V2) is outputted from the differential self-mixer 220.

The differential gain stage 230 in this example is utilized to further amplify the differential direct current signal (V2) outputted from the differential self-mixer 220. The differential gain stage 230 amplifies the differential direct current signal (V2) by the gain K. Thereafter, the amplified differential direct current signal (V3) is outputted from the differential gain stage 230.

The differential comparator 240 receives the amplified differential direct current signal (V3) at its differential input. The differential comparator 240 converts the amplified differential direct current signal (V3) to a digital squelch signal (Vo). For example, when the potential of the amplified differential direct current signal (V3) is greater than zero, the differential comparator outputs a squelch signal (Vo) having a first logic level. When the potential of the differential direct current signal (V3) is substantially zero or almost zero, the differential comparator outputs a squelch signal (Vo) having a second logic level. Thereafter, the squelch signal (Vo) is outputted from the differential comparator 240.

FIG. 3B shows an exemplary implementation of the differential offset biasing amplifier 210 of FIG. 3A. The differential offset biasing amplifier 210 includes a first transistor 241 and a second transistor 242 that are coupled to form a first differential pair. Likewise, the differential offset biasing amplifier 210 includes a third transistor 243 and fourth transistor 244 coupled to form a second differential pair. Further, the differential offset biasing amplifier 210 also includes a fifth transistor 245 and sixth transistor 246 coupled to form a third differential pair, and a seventh transistor 247 and eighth transistor 248 coupled to form a fourth differential pair.

Furthermore, the loads 249, 250, 251 and 252 of the differential pairs may be resistive elements, inductive elements, transistors configured as active loads, or the like.

In operation, the first differential pair 241, 242 receives the differential input signal (Vi⁺–Vi⁻) at its input terminals and the third differential pair 245, 246 receives the differential squelch detection threshold signal (Vth⁺–Vth⁻) at its input terminals. The outputs of the first differential pair 241, 242 and third differential pair 245, 246 are coupled together such that the differential squelch detection threshold signal (Vth⁺–Vth⁻) is subtracted from the differential input signals (Vi⁺–Vi⁻). Similarly, the second differential pair 243, 244 receives the differential input signal (Vi⁺–Vi⁻) at its input terminals and the fourth differential pair 247, 248 receives the differential squelch detection threshold signal (Vth⁺–Vth⁻) at its input terminals. The outputs of the second differential pair 243, 244 and fourth differential pair 247, 248 are coupled together such that the differential squelch detection threshold signal (Vth⁺–Vth⁻) is added to the differential input signals (Vi⁺–Vi⁻).

Thus, the coupled first differential pair 241, 242 and third differential pair 245, 246 provide positive peak detection by subtracting the differential squelch detection threshold signal (Vth⁺–Vth⁻) from the differential input signal (Vi⁺–Vi⁻). The coupled second differential pair 243, 244 and fourth differential pair 247, 248 provide negative peak detection by adding the differential squelch detection threshold signal (Vth⁺–Vth⁻) to the differential input signal (Vi⁺–Vi⁻).

FIG. 3C shows an exemplary implementation of the differential self-mixer 220 of FIG. 3A. The differential self-mixer 220 includes first and second transistors 253, 254 coupled to form a first differential pair, and third and fourth transistors 255, 256 coupled to form a second differential pair. The differential self-mixer 220 also includes fifth and sixth transistors 257, 258 coupled to form a third differential pair, and seventh and eighth transistors 259, 260 coupled to form a fourth differential pair.

The first differential pair 253, 254 receives the first differential offset biased signal (V1a+, V1a−) and the second differential pair 255, 256 receives the second offset biased differential signal (V1b+, V1b−). The third differential pair 257, 258 is coupled in series with the first differential pair 253, 254. The fourth differential pair 259, 260 is coupled in series with the second differential pair 255, 256. The outputs of the first differential pair 253, 254 and second differential pair 255, 256 are coupled together. Consequently, when the potential difference of the input signal (Vi) exceeds the potential difference of the squelch detection threshold signal (Vth), the positive and negative peaks from the differential offset biased signals (V1a, V1b) are selectively passed, mixed and down converted directly to a direct current signal (V2).

In particular, the third differential pair 257, 258 selectively provides the bias current IB to the first differential pair 253, 254 when the first side of the second differential offset biased signal (V1b+) is greater than the second side of the first differential offset biased signal (V1a−). Thus, the relatively small peaks of V1a 310 are selectively passed to the output during the relatively large peaks of V1b 330. Similarly, the fourth differential pair 259, 260 selectively provides the bias current IB to the second differential pair 255, 256 when the second side of the second differential offset biased signal (V1b−) is greater than the first side of the first differential offset biases signal (V1a+). Likewise, the relatively small peaks 320 of V1b are selectively passed to the output during the relatively large peaks 340 of V1a.

SUMMARY OF THE INVENTION

The present invention provides a novel squelch detector capable of distinguishing the valid differential input signal from the invalid differential input signal.

An embodiment of the present invention provides a squelch detector. The squelch detector includes a current steering circuit, a first differential pair circuit, a second differential pair circuit, a current sensing circuit, a current-to-voltage converter and a logic circuit. The current steering circuit generates a first current to a node c, generates a second current to a node d, generates a third current to a node e, and generates a fourth current to a node f. The first differential pair circuit is connected with the node c and the node d. The first differential pair circuit receives a first reference voltage and a second reference voltage, and controls the second current and the first current, so that a difference between the second current and the first current is equal to a current difference. The second differential pair circuit connected with the node e and the node f, wherein the second differential pair circuit receives a first input signal and a second input signal, and generates a fifth current and a sixth current. The current sensing circuit is connected with the node e, the node f, a node g and a node h. According to the third current, the fourth current, the fifth current and the sixth current, the current sensing circuit generates a first mirroring current to the node g and generates a second mirroring current to the node h. The current-to-voltage converter is connected with the node g and the node h. The current-to-voltage converter adjusts a first voltage level of the node g according to the first mirroring current and adjusts a second voltage level of the node h according to the second mirroring current. The logic circuit is connected with the node g and the node h, and generates a detected signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 4A:
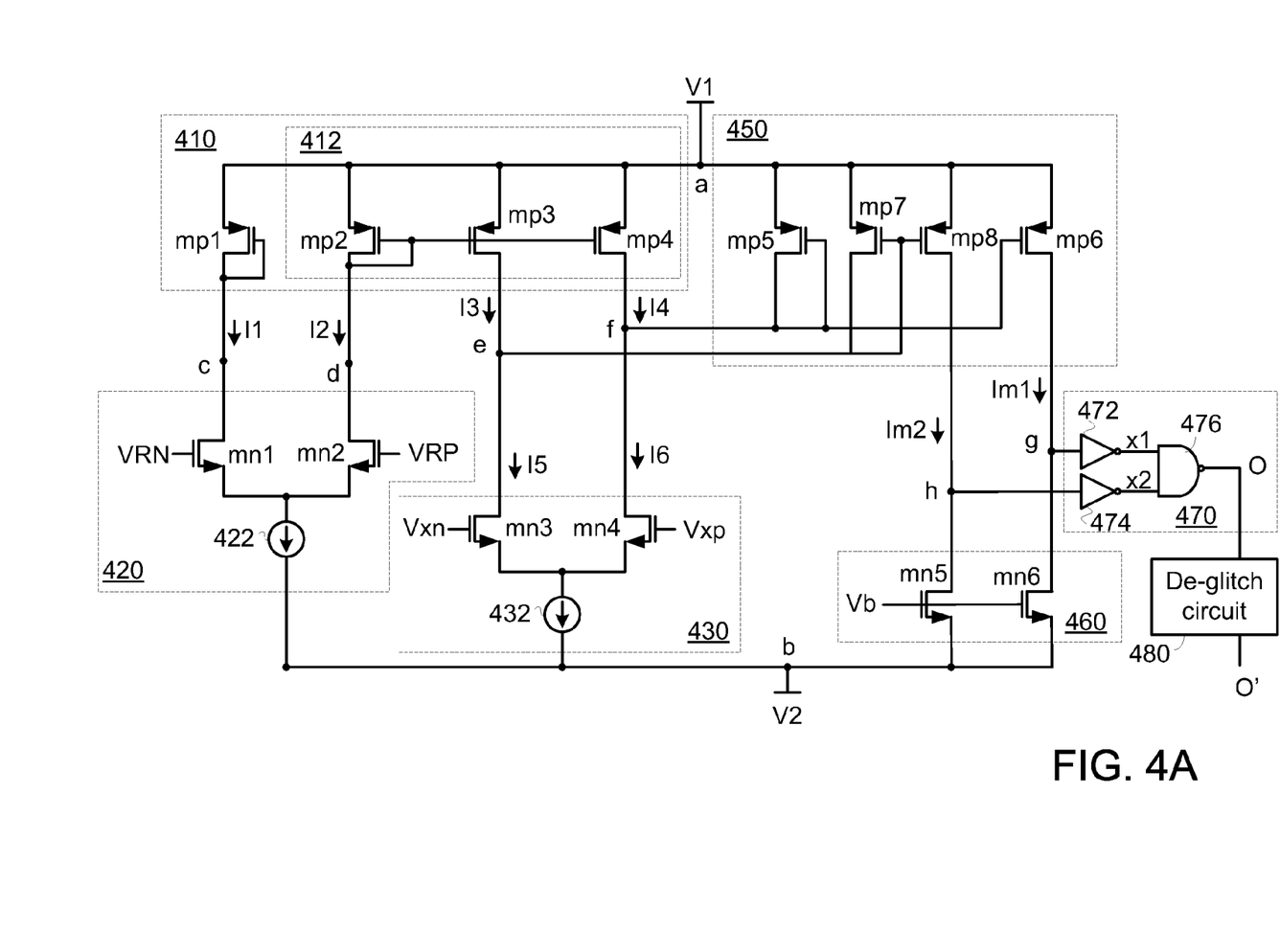
FIG. 4A schematically illustrates the architecture of a squelch detector according to an embodiment of the present invention FIG. 4B schematically illustrates the squelch detector of FIG. 4A in a first situation.

FIG. 4A schematically illustrates the architecture of a squelch detector according to an embodiment of the present invention. As shown in FIG. 4A, the squelch detector comprises a current steering circuit 410, a first differential pair circuit 420, a second differential pair circuit 430, a current sensing circuit 450, a current-to-voltage (I-to-V) converter 460, a logic circuit 470, and a deglitch circuit 480.

The current steering circuit 410 is connected with four nodes c, d, e and f. Moreover, the current steering circuit 410 generates a first current I1, a second current I2, a third current I3 and a fourth current I4 to the nodes c, d, e and f, respectively.

The first differential pair circuit 420 is connected with the nodes c and d. Moreover, the first differential pair circuit 420 receives a first reference voltage VRP and a second reference voltage VRN. By the first differential pair circuit 420, the difference between the second current I2 and the first current I1 is controlled to be equal to a current difference $\Delta i$. For example, if the magnitude of the first current I1 is equal to i, the magnitude of the second current I2 is equal to (i+$\Delta i$). The first reference voltage VRP is higher than the second reference voltage VRN. Moreover, the difference between the first reference voltage VRP and the second reference voltage VRN is defined as a squelch threshold.

The second differential pair circuit 430 is connected with the nodes e and f for receiving the third current I3 and the fourth current I4. Moreover, the second differential pair circuit 430 receives a first input signal Vxp and a second input signal Vxn, and generates a fifth current I5 and a sixth current I6. The first input signal Vxp and the second input signal Vxn are collaboratively defined as a differential input signal pair.

The current sensing circuit 450 is connected with the nodes e, f, g and h. The current-to-voltage converter 460 is connected with the node g and h. The logic circuit 470 is connected with the node g and h.

If the difference between the first input signal Vxp and the second input signal Vxn (i.e., Vxp−Vxn) is higher than the squelch threshold, the sixth current I6 is higher than the fourth current I4. Under this circumstance, the current sensing circuit 450 generates a first sensing current to the node f and generates a first mirroring current Im1 to the node g. Moreover, according to the first mirroring current Im1, the current-to-voltage converter 460 changes the voltage level of the node g. Consequently, a detected signal O from the logic circuit 470 is in a first logic-level state (e.g. a high logic-level state). The detected signal O in the first logic-level state represents the valid differential input signal pair.

On the other hand, if the difference between the second input signal Vxn and the first input signal Vxp (i.e., Vxn−Vxp) is higher than the squelch threshold, the fifth current I5 is higher than the third current I3. Under this circumstance, the current sensing circuit 450 generates a second sensing current to the node e and generates a second mirroring current Im2 to the node h. Moreover, according to the second mirroring current Im2, the current-to-voltage converter 460 changes the voltage level of the node h. Consequently, a detected signal O from the logic circuit 470 is in the first logic-level state (e.g. the high logic-level state). The detected signal O in the first logic-level state represents the valid differential input signal pair.

On the other hand, if the difference between the first input signal Vxp and the second input signal Vxn (i.e., Vxp−Vxn) is lower than the squelch threshold or the difference between the second input signal Vxn and the first input signal Vxp (i.e., Vxn−Vxp) is lower than the squelch threshold, the third current I3 is higher than the fifth current I5 and the fourth current I4 is higher than the sixth current I6. Under this circumstance, the sensing current from the current sensing circuit 450 to the node e or f is zero or almost zero, and the mirroring current from the current sensing circuit 450 to the node g or h is zero or almost zero. Moreover, the current-to-voltage converter 460 does not change the voltage levels of the node g and the node h. Consequently, the detected signal O from the logic circuit 470 is in a second logic-level state (e.g. a low logic-level state). The detected signal O in the second logic-level state represents the invalid differential input signal pair.

Furthermore, de-glitch circuit 480 receives the detected signal O and generates the deglitched signal O'. By the de-glitch circuit 480, the temporary low logic-level state of the detected signal O will not change the level of the deglitched signal O'. In other words, the deglitched signal O' is still in the high logic-level state, representing the valid differential input signal.

The circuitry configuration of the squelch detector will be illustrated in more details as follows. Please refer to FIG. 4A again. A node a of the squelch detector is connected with a first power supply voltage V1. A node b of the squelch detector is connected with a second power supply voltage V2. For example, the second power supply voltage V2 is a ground voltage.

The current steering circuit 410 comprises four transistors mp1, mp2, mp3 and mp4. The source terminal of the transistor mp1 is connected with the node a. The drain terminal and the gate terminal of the transistor mp1 are connected with the node c, and generate the first current I1. The source terminal of the transistor mp2 is connected with the node a. The drain terminal and the gate terminal of the transistor mp2 are connected with the node d, and generate the second current I2. The source terminal of the transistor mp3 is connected with the node a. The gate terminal of the transistor mp3 is connected with the node d. The drain terminal of the transistor mp3 is connected with the node e, and generates the third current I3. The source terminal of the transistor mp4 is connected with the node a. The gate terminal of the transistor mp4 is connected with the node d. The drain terminal of the transistor mp4 is connected with the node f, and generates the fourth current I4. Obviously, the transistors mp2, mp3 and mp4 are collaboratively formed as a first current mirror 412. In case that the transistors mp2, mp3 and mp4 have the same size, the magnitudes of the second current I2, the third current I3 and the fourth current I4 are equal.

The first differential pair circuit 420 comprises two transistors mn1, mn2 and a first current source 422. The drain terminal of the transistor mn1 is connected with the node c. The gate terminal of the transistor mn1 receives the second reference voltage VRN. The source terminal of the transistor mn1 is connected with a first terminal of the first current source 422. The drain terminal of the transistor mn2 is connected with the node d. The gate terminal of the transistor mn2 receives the first reference voltage VRP. The source terminal of the transistor mn2 is connected with the first terminal of the first current source 422. Moreover, a second terminal of the first current source 422 is connected with a node b. According to the first reference voltage VRP and the second reference voltage VRN, the first current I1 and the second current I2 are controlled by the first differential pair circuit 420. Consequently, the second current I2 is higher than the first current I1, and the difference between the second current I2 and the first current I1 is equal to the current difference Δi.

The second differential pair circuit 430 comprises two transistors mn3, mn4 and a second current source 432. The drain terminal of the transistor mn3 is connected with the node e. The gate terminal of the transistor mn3 receives the second input signal Vxn. The source terminal of the transistor mn3 is connected with a first terminal of the second current source 432. The drain terminal of the transistor mn4 is connected with the node f. The gate terminal of the transistor mn4 receives the first input signal Vxp. The source terminal of the transistor mn4 is connected with the first terminal of the second current source 432. Moreover, a second terminal of the second current source 432 is connected with the node b. The second differential pair circuit 430 receives the first input signal Vxp and the second input signal Vxn, and generates the fifth current I5 and the sixth current I6.

The current sensing circuit 450 comprises four transistors mp5, mp6, mp7 and mp8. The transistors mp5 and mp6 are collaboratively formed as a second current mirror. The transistors mp7 and mp8 are collaboratively formed as a third current mirror. The source terminal of the transistor mp5 is connected with the node a. The drain terminal and the gate terminal of the transistor mp5 are connected with the node f.

The source terminal of the transistor mp6 is connected with the node a. The gate terminal of the transistor mp6 is connected with the node f. The drain terminal of the transistor mp6 is connected with the node g. The source terminal of the transistor mp7 is connected with the node a. The drain terminal and the gate terminal of the transistor mp7 are connected with the node e. The source terminal of the transistor mp8 is connected with the node a. The gate terminal of the transistor mp8 is connected with the node e. The drain terminal of the transistor mp8 is connected with the node h. In this embodiment, the size of the transistor mp6 is N times the size of the transistor mp5, and the size of the transistor mp8 is N times the size of the transistor mp7. Consequently, the magnitude of the mirroring current is N times the magnitude of the corresponding sensing current.

The current-to-voltage converter 460 comprises two transistors mn5 and mn6. The source terminal of the transistor mn5 is connected with the node b. The gate terminal of the transistor mn5 receives a bias voltage Vb. The drain terminal of the transistor mn5 is connected with the node h. The source terminal of the transistor mn6 is connected with the node b. The gate terminal of the transistor mn6 receives the bias voltage Vb. The drain terminal of the transistor mn6 is connected with the node g. Generally, the transistors mn5 and mn6 are used as resistive loads. Consequently, the transistors mn5 and mn6 can be replaced by two resistors. Under this circumstance, the first resistor is connected between the node h and the node b, and the second resistor is connected between the node g and the node b.

The logic circuit 470 comprises a first inverter 472, a second inverter 474 and a NAND gate 476. The input terminal of the first inverter 472 is connected with the node g. The input terminal of the second inverter 474 is connected with the node h. The two input terminals of the NAND gate 476 are connected with the output terminal x1 of the first inverter 472 and the output terminal x2 of the second inverter 474, respectively. The detected signal O is outputted from the output terminal of the NAND gate 476.

As mentioned above, if the difference between the first input signal Vxp and the second input signal Vxn (i.e., Vxp−Vxn) is lower than the squelch threshold or the difference between the second input signal Vxn and the first input signal Vxp (i.e., Vxn−Vxp) is lower than the squelch threshold, the third current I3 is higher than the fifth current I5 and the fourth current I4 is higher than the sixth current I6. Under this circumstance, the sensing current from the current sensing circuit 450 to the node e or f is zero or almost zero, and the mirroring current from the current sensing circuit 450 to the node g or h is zero or almost zero. Consequently, the voltage levels of the node g and the node h are maintained at the low logic levels by the current-to-voltage converter 460. Meanwhile, the detected signal O from the logic circuit 470 is in the low logic-level state. The detected signal O in the low logic-level state represents the invalid differential input signal pair.

When the squelch detector receives the invalid differential input signal pair, no quiescent current is generated by the current sensing circuit 450, the current-to-voltage converter 460 and the logic circuit 470. In other words, the squelch detector receives the invalid differential input signal pair during the standby period. Consequently, the power consumption is very low.

Figure 4B:
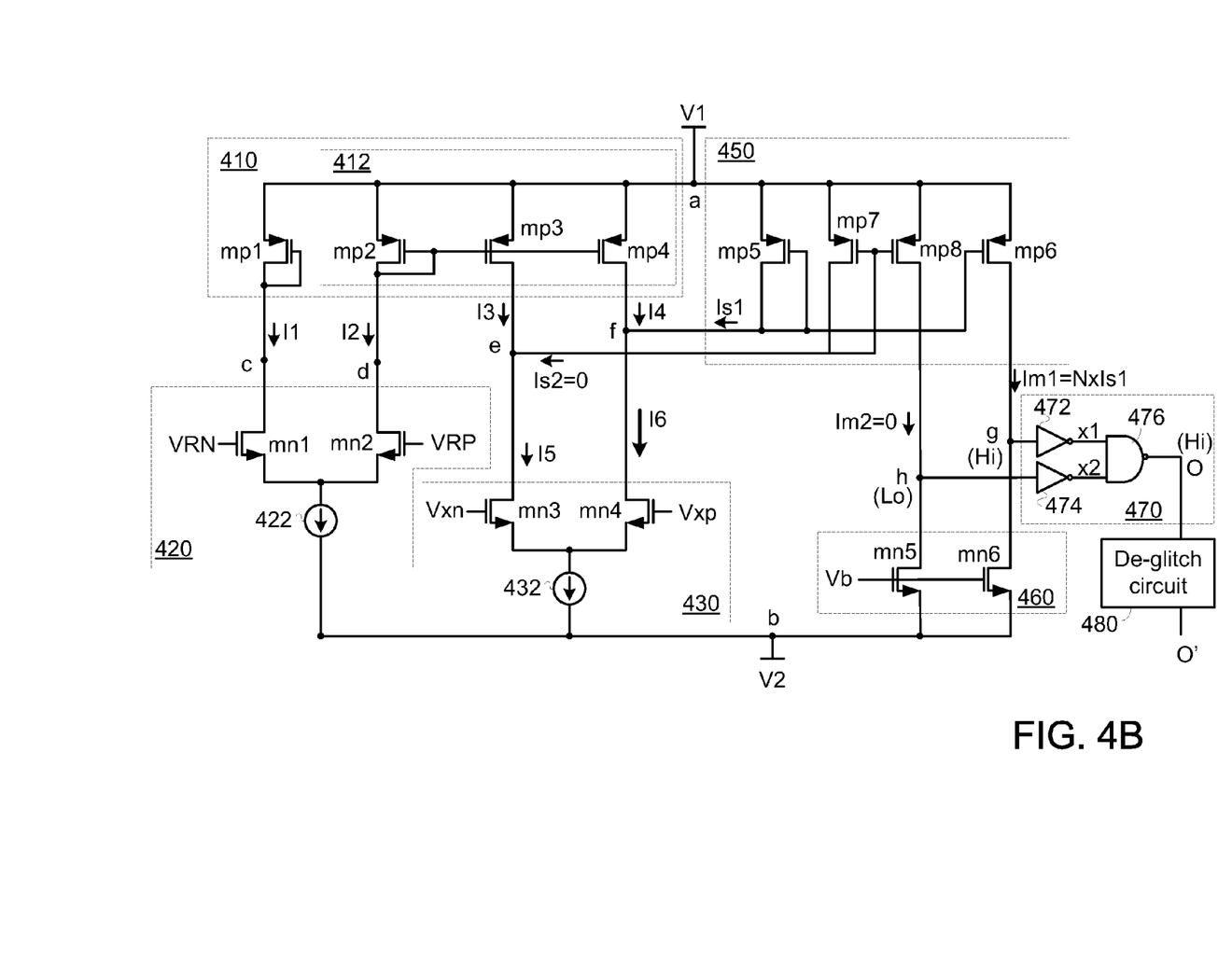

FIG. 4B schematically illustrates the squelch detector of FIG. 4A in a first situation. If the difference between the first input signal Vxp and the second input signal Vxn (i.e., Vxp−Vxn) is higher than the squelch threshold, the sixth current I6 is higher than the fourth current I4. Under this circumstance, the current sensing circuit 450 generates a first sensing current Is1 to the node f (i.e., I4+Is1=I6), and the second current mirror generates a first mirroring current Im1 to the node g. Moreover, the magnitude of the first mirroring current Im1 is N times the magnitude of the first sensing current Is1 (i.e., Im1=N×Is1). Since the third current I3 is higher than the fifth current I5, the second sensing current Is2 from the current sensing circuit 450 to the node e is zero or almost zero (i.e., Is2=0), and the second mirroring current Im2 from the third current mirror is zero or almost zero (i.e., Im2=0).

Moreover, according to the first mirroring current Im1, the current-to-voltage converter 460 changes the logic level of the node g to a high logic level (Hi). Moreover, according to the second mirroring current Im2, the current-to-voltage converter 460 maintains the logic level of the node h at the low logic level (Lo). Consequently, the detected signal O from the logic circuit 470 is in the high logic-level state (Hi), representing the valid differential input signal pair.

Figure 4C:
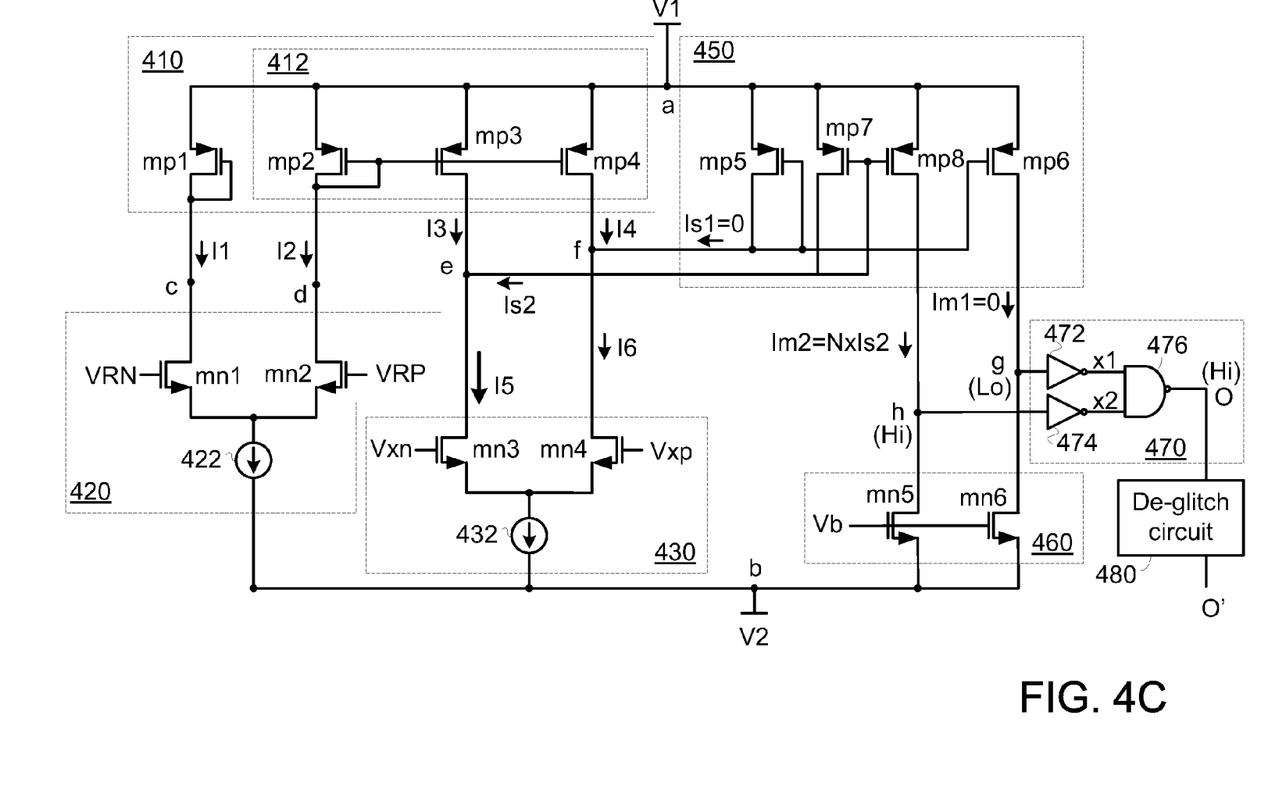
FIG. 4C schematically illustrates the squelch detector of FIG. 4A in a second situation.

FIG. 4C schematically illustrates the squelch detector of FIG. 4A in a second situation. If the difference between the second input signal Vxn and the first input signal Vxp (i.e., Vxn−Vxp) is higher than the squelch threshold, the fifth current I5 is higher than the third current I3. Under this circumstance, the current sensing circuit 450 generates a second sensing current Is2 to the node e (i.e., I3+Is2=I5), and the third current mirror generates the second mirroring current Im2 to the node h. Moreover, the magnitude of the second mirroring current Im2 is N times the magnitude of the second sensing current Is2 (i.e., Im2=N×Is2). Since the fourth current I4 is higher than the sixth current I6, the first sensing current Is1 from the current sensing circuit 450 to the node e is zero or almost zero (i.e., Is1=0), and the first mirroring current Im1 from the second current mirror is zero or almost zero (i.e., Im1=0).

Moreover, according to the first mirroring current Im1, the current-to-voltage converter 460 maintains the logic level of the node g at the low logic level (Lo). Moreover, according to the second mirroring current Im2, the current-to-voltage converter 460 changes the logic level of the node h to the high logic level (Hi). Consequently, the detected signal O from the logic circuit 470 is in the high logic-level state (Hi), representing the valid differential input signal pair.

Figure 4D:
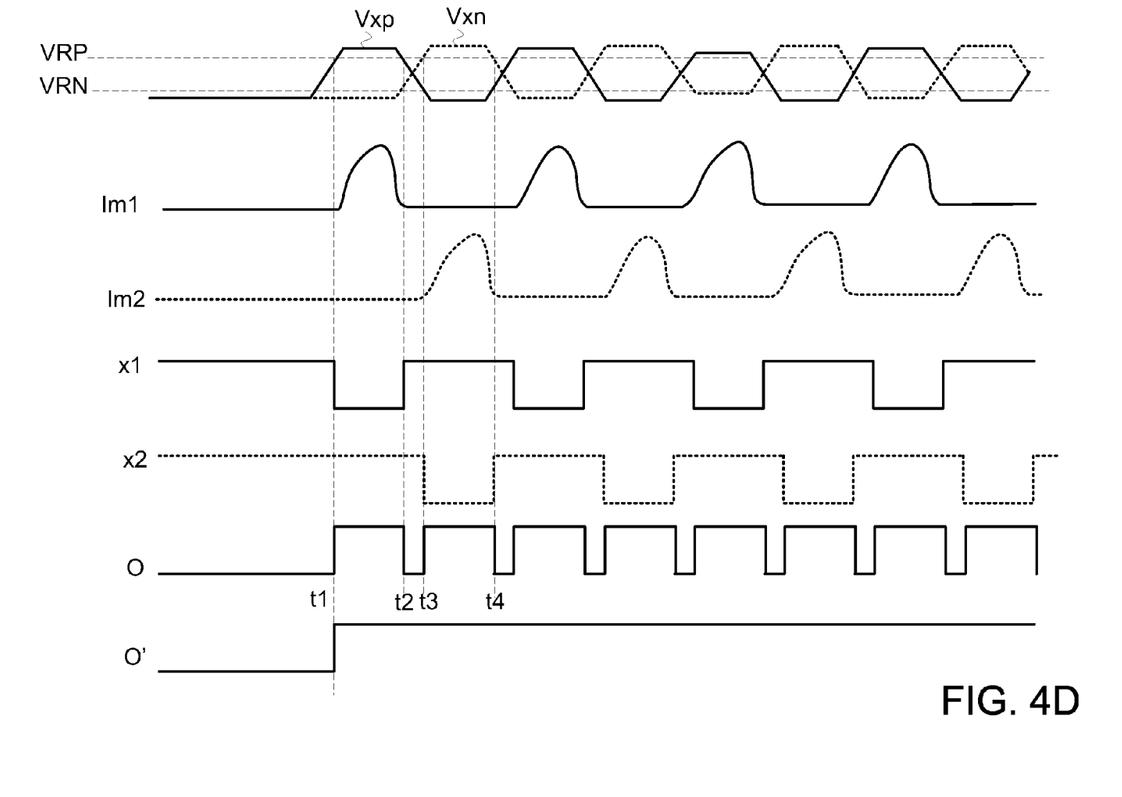
FIG. 4D is a schematic timing waveform diagram illustrating associated signals processed by the squelch detector according to the embodiment of the present invention.

FIG. 4D is a schematic timing waveform diagram illustrating associated signals processed by the squelch detector according to the embodiment of the present invention.

Before the time point t1, the squelch detector is in a standby period. That is, the difference between the two input signals of the differential input signal pair is lower than the squelch threshold. Consequently, both of the first mirroring current Im1 and the second mirroring current Im2 are zero or almost zero. Meanwhile, both of the output terminal x1 of the first inverter 472 and the output terminal x2 of the second inverter 474 are in the high logic-level state (Hi). Consequently, the detected signal O is in the low logic-level state (Lo), representing the invalid differential input signal pair.

In the time interval between the time point t1 and the time point t2, the difference between the first input signal Vxp and the second input signal Vxn (i.e., Vxp−Vxn) is higher than the squelch threshold. Consequently, the first mirroring current Im1 is not zero, but the second mirroring current Im2 is zero or almost zero. Meanwhile, the output terminal x1 of the first inverter 472 is in the low logic-level state (Lo), and the output terminal x2 of the second inverter 474 is in the high logic-level state (Hi). Consequently, the detected signal O is in the high logic-level state (Hi), representing the valid differential input signal pair.

In the time interval between the time point t2 and the time point t3, the difference between the two input signals of the differential input signal pair is lower than the squelch threshold. Consequently, the detected signal O is in the low logic-level state (Lo), representing the invalid differential input signal pair.

In the time interval between the time point t3 and the time point t4, the difference between the second input signal Vxn and the first input signal Vxp (i.e., Vxn−Vxp) is higher than the squelch threshold. Consequently, the first mirroring current Im1 is zero or almost zero, but the second mirroring current Im2 is not zero. Meanwhile, the output terminal x1 of the first inverter 472 is in the high logic-level state (Hi), and the output terminal x2 of the second inverter 474 is in the low logic-level state (Lo). Consequently, the detected signal O is in the high logic-level state (Hi), representing the valid differential input signal pair.

Similarly, the relationships between the associated signals after the time point t4 are similar to those in the time interval between the time point t1 and the time point t4. The principles are not redundantly described herein.

Moreover, the time interval between the time point t2 and the time point t3 indicates a transition state of the first input signal Vxp and the second input signal Vxn. In the transition state, the detected signal O is temporarily in the low logic-level state (Lo). The de-glitch circuit 480 is connected with the output terminal of the NAND gate 476 for preventing the temporary change of the detected signal O. Consequently, the deglitched signal O' is continuously in the high logic-level state after the time point t1, representing the valid differential input signal pair.

From the above descriptions, the squelch detector of the present invention receives the first input signal Vxp, the second input signal Vxn, the first reference voltage VRP and the second reference voltage VRN. Moreover, the squelch detector generates the detected signal O to indicate whether the differential input signal is valid or not. It is noted that the circuitry configurations of the logic circuit 470 are not restricted. That is, other logic circuits may be combined as the judging circuit while achieving the similar functions.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A squelch detector, comprising:
   a current steering circuit generating a first current to a node c, generating a second current to a node d, generating a third current to a node e, and generating a fourth current to a node f;
   a first differential pair circuit connected with the node c and the node d, wherein the first differential pair circuit receives a first reference voltage and a second reference voltage, and controls the second current and the first current, so that a difference between the second current and the first current is equal to a current difference;
   a second differential pair circuit connected with the node e and the node f, wherein the second differential pair circuit receives a first input signal and a second input signal, and generates a fifth current and a sixth current;
   a current sensing circuit connected with the node e, the node f, a node g and a node h, wherein according to the third current, the fourth current, the fifth current and the sixth current, the current sensing circuit generates a first mirroring current to the node g and generates a second mirroring current to the node h;

a current-to-voltage converter connected with the node g and the node h, wherein the current-to-voltage converter adjusts a first voltage level of the node g according to the first mirroring current and adjusts a second voltage level of the node h according to the second mirroring current; and a logic circuit connected with the node g and the node h, and generating a detected signal.

2. The squelch detector as claimed in claim 1, wherein a difference between the first reference voltage and the second reference voltage is defined as a squelch threshold, wherein the first input signal and the second input signal are collaboratively defined as a differential input signal pair.

3. The squelch detector as claimed in claim 2, wherein if a difference between the first input signal and the second input signal is higher than the squelch threshold, then the sixth current is higher than the fourth current, and the current sensing circuit generates a first sensing current to the node f and generates the first mirroring current to the node g, wherein according to the first mirroring current, the current-to-voltage converter changes the first voltage level of the node g, and the detected signal from the logic circuit is in a first logic-level state to indicate that the differential input signal pair is valid.

4. The squelch detector as claimed in claim 3, wherein if a difference between the second input signal and the first input signal is higher than the squelch threshold, then the fifth current is higher than the third current, and the current sensing circuit generates a second sensing current to the node e and generates the second mirroring current to the node h, wherein according to the second mirroring current, the current-to-voltage converter changes the second voltage level of the node h, and the detected signal from the logic circuit is in the first logic-level state to indicate that the differential input signal pair is valid.

5. The squelch detector as claimed in claim 4, wherein if a difference between the first input signal and the second input signal is lower than the squelch threshold or a difference between the second input signal and the first input signal is lower than the squelch threshold, then the third current is higher than the fifth current and the fourth current is higher than the sixth current, wherein all of the first sensing current, the second sensing current, the first mirroring current and the second mirroring current are zero or almost zero, and the detected signal from the logic circuit is in a second logic-level state to indicate that the differential input signal pair is invalid.

6. The squelch detector as claimed in claim 2, wherein the squelch detector is connected with a node a and a node b, wherein the node a is connected with a first power supply voltage, and the node b is connected with a second power supply voltage.

7. The squelch detector as claimed in claim 6, wherein the current steering circuit comprises:

a first transistor, wherein a source terminal of the first transistor is connected with the node a, and a drain terminal and a gate terminal of the first transistor are connected with the node c and generate the first current;

a second transistor, wherein a source terminal of the second transistor is connected with the node a, and a drain terminal and a gate terminal of the second transistor are connected with the node d and generate the second current;

a third transistor, wherein a source terminal of the third transistor is connected with the node a, a gate terminal of the third transistor is connected with the node d, and a drain terminal of the third transistor is connected with the node e and generates the third current; and a fourth transistor, wherein a source terminal of the fourth transistor is connected with the node a, a gate terminal of the fourth transistor is connected with the node d, and a drain terminal of the fourth transistor is connected with the node f and generates the fourth current.

8. The squelch detector as claimed in claim 6, wherein the first differential pair circuit comprises:

a fifth transistor, wherein a drain terminal of the fifth transistor is connected with the node c, and a gate terminal of the fifth transistor receives the second reference voltage;

a sixth transistor, wherein a drain terminal of the sixth transistor is connected with the node d, and a gate terminal of the sixth transistor receives the first reference voltage; and a first current source, wherein a first terminal of the first current source is connected with a source terminal of the fifth transistor and a source terminal of the sixth transistor, and a second terminal of the first current source is connected with the node b.

9. The squelch detector as claimed in claim 6, wherein the second differential pair circuit comprises:

a seventh transistor, wherein a drain terminal of the seventh transistor is connected with the node e and generates the fifth current, and a gate terminal of the seventh transistor receives the second input signal;

an eighth transistor, wherein a drain terminal of the eighth transistor is connected with the node f and generates the sixth current, and a gate terminal of the eighth transistor receives the first input signal; and a second current source, wherein a first terminal of the second current source is connected with a source terminal of the seventh transistor and a source terminal of the eighth transistor, and a second terminal of the second current source is connected with the node b.

10. The squelch detector as claimed in claim 6, wherein the current sensing circuit comprises:

a ninth transistor, wherein a source terminal of the ninth transistor is connected with the node a, and a drain terminal and a gate terminal of the ninth transistor are connected with the node f and generate a first sensing current;

a tenth transistor, wherein a source terminal of the tenth transistor is connected with the node a, a gate terminal of the tenth transistor is connected with the node f, and a drain terminal of the tenth transistor is connected with the node g and generates the first mirroring current;

an eleventh transistor, wherein a source terminal of the eleventh transistor is connected with the node a, and a drain terminal and a gate terminal of the eleventh transistor are connected with the node e and generate a second sensing current; and a twelfth transistor, wherein a source terminal of the twelfth transistor is connected with the node a, a gate terminal of the twelfth transistor is connected with the node e, and a drain terminal of the twelfth transistor is connected with the node h and generates the second mirroring current.

11. The squelch detector as claimed in claim 6, wherein the current-to-voltage converter comprises:

a thirteenth transistor, wherein a source terminal of the thirteenth transistor is connected with the node b, a gate terminal of the thirteenth transistor receives a bias voltage, and a drain terminal of the thirteenth transistor is connected with the node h; and a fourteenth transistor, wherein a source terminal of the fourteenth transistor is connected with the node b, a gate terminal of the fourteenth transistor receives the bias voltage, and a drain terminal of the fourteenth transistor is connected with the node g.

12. The squelch detector as claimed in claim 6, wherein the current-to-voltage converter comprises:
- a first resistor connected between the node b and the node h; and
- a second resistor connected between the node b and the node g.

13. The squelch detector as claimed in claim 6, wherein the logic circuit comprises:
- a first inverter having an input terminal connected with the node g;
- a second inverter having an input terminal connected with the node h; and
- a NAND gate, wherein two input terminals of the NAND gate are connected with an output terminal of the first inverter and an output terminal of the second inverter, respectively.

14. The squelch detector as claimed in claim 6, wherein the logic circuit comprises:
- a first inverter having an input terminal connected with the node g;
- a second inverter having an input terminal connected with the node h;
- a NAND gate, wherein two input terminals of the NAND gate are connected with an output terminal of the first inverter and an output terminal of the second inverter, respectively; and
- a de-glitch circuit, wherein an input terminal of the de-glitch circuit is connected with an output terminal of the NAND gate, and an output terminal of the de-glitch circuit generates the detected signal.

* * * * *